US009866223B2

(12) United States Patent
Guinea Trigo

(10) Patent No.: US 9,866,223 B2
(45) Date of Patent: Jan. 9, 2018

(54) CLOCK RECOVERY CIRCUIT, RELATED CLOCK AND DATA RECOVERY CIRCUIT, RECEIVER, INTEGRATED CIRCUIT AND METHOD

(71) Applicant: STMicroelectronics S.r.l., Agrate Brianza (IT)

(72) Inventor: Jesus Alejandro Guinea Trigo, Brembate (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/190,020

(22) Filed: Jun. 22, 2016

(65) Prior Publication Data
US 2017/0163267 A1    Jun. 8, 2017

(30) Foreign Application Priority Data
Dec. 7, 2015  (IT) .......................... 102015000080928

(51) Int. Cl.
*H04L 7/00*  (2006.01)
*H03D 3/24*  (2006.01)
(Continued)

(52) U.S. Cl.
CPC ............ *H03L 7/0807* (2013.01); *H03L 7/087* (2013.01); *H03L 7/0891* (2013.01); *H03L 7/093* (2013.01);
(Continued)

(58) Field of Classification Search
USPC ....... 375/211, 215, 214, 219, 220, 222, 240, 375/240.26–240.27, 259, 285, 284, 278,
(Continued)

(56) References Cited

U.S. PATENT DOCUMENTS 5,790,613 A    8/1998  Tateishi
6,078,634 A *  6/2000  Bosshart .............. H03D 13/004
                                                          331/1 A
(Continued)

OTHER PUBLICATIONS

Italian Search Report, dated Jul. 20, 2016, for Italian Application No. UB20156885, 8 pages.
(Continued)

*Primary Examiner* — Linda Wong
(74) *Attorney, Agent, or Firm* — Seed IP Law Group LLP

(57) ABSTRACT

A clock recovery circuit includes an oscillator to generate a clock signal. The oscillator varies a frequency of the clock signal as a function of a control signal. The clock recovery circuit has a phase tracking control loop to determine the phase error between the reference signal and the clock signal, and vary the control signal as a function of the phase error. The phase tracking control loop has a linear region for phase errors in the range between $-\pi$ and $+\pi$, thereby creating a cycle slippage event when the phase error exceed said range. The clock recovery circuit includes a cycle-slippage detector which determines whether the phase error reaches or approaches $+\pi$ or $-\pi$. In case the phase error reaches or approaches $+\pi$ or $-\pi$, the cycle-slippage detector acts on the control signal in an effort to avoid that said phase tracking control loop leaves said linear region.

31 Claims, 9 Drawing Sheets

(51) Int. Cl.
| | | |
|---|---|---|
| *H03L 7/08* | (2006.01) | |
| *H03L 7/087* | (2006.01) | |
| *H03L 7/14* | (2006.01) | |
| *H04L 7/033* | (2006.01) | |
| *H03L 7/089* | (2006.01) | |
| *H03L 7/093* | (2006.01) | |
| *H03L 7/113* | (2006.01) | |

(52) U.S. Cl.
CPC ............... *H03L 7/113* (2013.01); *H03L 7/14* (2013.01); *H04L 7/0079* (2013.01); *H04L 7/033* (2013.01)

(58) Field of Classification Search
USPC ... 375/272, 294, 293, 295, 311, 303, 316, 3, 375/40, 346, 347, 354, 358, 359, 373, 375/374, 375, 376, 371, 362
See application file for complete search history.

(56) References Cited

U.S. PATENT DOCUMENTS

| | | | | |
|---|---|---|---|---|
| 6,392,457 | B1 | 5/2002 | Ransijn | |
| 6,522,207 | B1* | 2/2003 | Boerstler | G06F 7/68 327/156 |
| 6,566,921 | B1* | 5/2003 | Boerstler | H03L 7/23 327/117 |
| 8,537,957 | B2* | 9/2013 | Lesso | H03L 7/087 375/371 |
| 8,599,983 | B2* | 12/2013 | Sidiropoulos | H04L 7/0008 375/288 |
| 9,136,949 | B1* | 9/2015 | Shih | H03L 7/0807 |
| 2002/0125961 | A1 | 9/2002 | Jones et al. | |
| 2003/0184346 | A1* | 10/2003 | Lamb | H03D 13/004 327/12 |
| 2004/0135639 | A1* | 7/2004 | Maneatis | H03L 7/0893 331/16 |
| 2004/0196940 | A1* | 10/2004 | Chien | H03K 21/10 375/376 |
| 2014/0210525 | A1* | 7/2014 | Jenkins | H03L 7/087 327/150 |
| 2014/0320186 | A1* | 10/2014 | Jin | H03L 7/1075 327/159 |
| 2015/0222280 | A1* | 8/2015 | Allan | H03L 7/083 327/157 |
| 2016/0112055 | A1* | 4/2016 | Mirajkar | H03L 7/095 327/158 |
| 2016/0182065 | A1* | 6/2016 | Wicpalek | H03L 7/099 327/156 |
| 2016/0191231 | A1* | 6/2016 | Stoll | H04L 7/033 455/77 |

OTHER PUBLICATIONS

Meyer et al., "Digital Communication Receivers: Synchronization, Channel Estimation, and Signal Processing," Chapter 6, Section 4, 1997, pp. 385-399. (15 pages).

Hogge, Jr., "A Self Correcting Clock Recovery Circuit," *Journal of Lightwave Technology* LT—3(6):1312-1314, 1985.

Hsieh et al., "Architectures for Multi-Gigabit Wire-Linked Clock and Data Recovery," *IEEE Circuits and Systems Magazine*, Fourth Quarter, pp. 45-57, 2008.

Kenney et al., "A 9.95-11.3-Gb/s XFP Transceiver in 0.13-μm CMOS," *IEEE Journal of Solid-State Circuits* 41(12):2901-2910, Dec. 2006.

Lee et al., "A 155-MHz Clock Recovery Delay- and Phase-Locked Loop," *IEEE Journal of Solid-State Circuits* 27(12):1736-1746, 1992.

Optical Internetworking Forum, "IA Title: Common Electrical I/O (CEI)—Electrical and Jitter Interoperability agreements for 6G+ bps and 11G+ bps I/O," IA # OIF-CEI-02.0, Feb. 28, 2005, 180 pages.

Rhee et al., "A 10-GB/s CMOS Clock and Data Recovery Circuit Using a Secondary Delay-Locked Loop," *IEEE 2003 Custom Integrated Circuits Conference*, pp. 81-84, 2003.

Rogers et al., "A 10-Gb/s CDR/DEMUX With LC Delay Line VCO in 0.18-μm CMOS," *IEEE Journal of Solid-State Circuits*, 37(12):1781-1789, 2002.

* cited by examiner

CLOCK RECOVERY CIRCUIT, RELATED CLOCK AND DATA RECOVERY CIRCUIT, RECEIVER, INTEGRATED CIRCUIT AND METHOD

BACKGROUND

Technical Field

Embodiments of the present disclosure relate to techniques for reducing the influence of cycle slippage in a clock recovery circuit.

Description of the Related Art

FIG. 1 shows a generic transmission system in which a transmitter 1 transmits data over a communication channel 2 to a receiver 3. For example, the communication channel may be a cable, an optical fiber or a radio communication channel.

For this purpose, the transmitter 1 may comprise a transmitter circuit 10, such as a network processor, generating data D_TX and an interface circuit 12 configured to receive the data D_TX and transmit a corresponding signal to the communication channel 2. For example, the interface circuit 12 may convert the data D_TX into an optical signal, e.g., for transmission over an optical fiber.

Specifically, in the example considered, the transmitter circuit 10 is synchronous, e.g., generation of the data signal D_TX is synchronized with a transmission clock signal CLK_TX, generated e.g., by a clock generator 14, such as a voltage controlled oscillator and possibly a PLL (Phase-Locked Loop).

Similarly, the receiver 3 may comprise an interface circuit 32 configured to receive the signal transmitted over the communication channel 2 and provide a respective data signal D_RX to a receiver circuit 30, such as a network processor, configured to process the received data D_RX. For example, the interface circuit 32 may convert an optical signal received from an optical fiber again into an electric signal. For this purpose, the interface circuit 32 may comprise, e.g., a photo-diode, a trans-impedance amplifier (TIA) and a low-noise amplifier (LNA).

In the example considered, also the receiver circuit 30 is synchronous, i.e., processing of the data signal D_RX is synchronized with a clock signal.

For example, in FIG. 1, the operation of the receiver circuit 30 is synchronized with a reception clock signal CLK_RX generated by a clock generator 34, such as a voltage controlled oscillator and possibly a PLL.

Accordingly, in order to correctly receive the data D_RX, the clock signal CLK_RX should correspond to the clock signal CLK_TX used for transmission (neglecting the possibility of performing an oversampling of the data). Moreover, especially in case of high data rates, which renders oversampling complicated, the data D_RX should be phase aligned with respect to the reception clock signal CLK_RX. Accordingly, the receiver 3 may also comprise a phase shifter 36, such as a Delay Locked Loop (DLL), interposed between the interface 32 and the receiver circuit 30. Specifically, this phase shifter 36 may be configured to generate a delayed signal D_RX' being synchronized with the clock signal CLK_RX.

Often the receiver circuit 30 has to be able to operate with different transmission rates, e.g., because the transmitter circuit 10 may support different transmission rates. Moreover, also the clock signals CLK_TX and CLK_RX may not correspond exactly.

FIG. 2 shows in this respect an embodiment, in which a clock and data recovery (CDR) circuit 50 is used to autonomously estimate the clock signal CLK_TX' used for transmission of the data D_TX.

Specifically, the CDR 50 permits to extract the transmitted data sequence D_RX' from the distorted received signal D_RX and to recover the associated clock signal CLK_TX'.

As shown in FIG. 3, the circuit 50 usually comprises a clock recovery circuit 54 configured to detect the transitions in the received data signal D_RX and generate a periodic clock CLK_TX'.

Generally, two types of clock recovery circuits 54 exits: clock recovery circuits 54 operating with a reference clock signal CLK_REF, generated e.g., by the oscillator 34, and clock recovery circuits 54 operating without a reference clock signal CLK_REF.

Often the circuit 50 comprises also a decision circuit 52, such as one or more flip-flops, e.g., D flip-flops, connected in cascade, which sample the received data signal D_RX in accordance with the recovered clock signal CLK_TX'. Accordingly, the sampled data signal D_RX' at the output of the decision circuit 52 usually has less jitter, skew and/or noise.

For example, the architecture shown in FIG. 2 may be used in a Synchronous Optical Network (SONET), which is often used in the transport infrastructure of wide area networks (WAN) backbones, e.g., the Internet. See, The related standards concerning SONET.

Especially for high data rates, the implementation of the clock recover circuit 54 may impact the reception of the data. For this reason a lot of different implementations of CDR circuits have been proposed in literature.

For example, FIG. 4 shows a PLL based CDR architecture without reference clock.

Specifically, in the example considered, the clock-recover circuit 54 comprises a voltage controlled oscillator (VCO) 540, such as a series of inverters with variable supply voltage, and at least a first control loop.

Specifically, in the example considered, the first control loop represents a phase tracking loop comprising a phase detector (PD) 542, a charge pump 544 and a loop filter (LF) 546.

Specifically, the phase detector 542 performs a phase comparison between the input data D_RX and the voltage-controlled oscillator output CLK_TX'. Accordingly, in the example considered, the phase detector 542 varies (via the charge pump 544 and the loop filter 546) the control voltage of the oscillator 540 in order to perform a tuning of the clock signal CLK_TX' thereby adjusting the oscillation frequency and the phase shift of the clock signal CLK_TX' with respect to the data signal D_RX'.

Often, the PLL (comprising the components 540-546) is only used for the fine tuning of the oscillation frequency, and a reference clock signal or a second (optional) control loop is used for the coarse tuning.

For example, in FIG. 4, the second control loop represents a frequency tracking loop comprising a frequency detector (FD) 548, a charge pump 550 and a loop filter, which may also correspond to the loop filter 546. Specifically, the frequency detector 548 performs a frequency comparison between the input data D_RX and the voltage-controlled oscillator output CLK_TX'. Specifically, the control voltage is varied (i.e., increased or decreased) until the oscillation frequency of the signal CLK_TX' corresponds approximately to the data rate of the input signal D_RX.

Typically, the frequency tracking loop is activated during start-up or loss of synchronization in order to generate the control voltage for the oscillator 540 via the charge pump 550. Once the frequency difference falls within given limits, the phase tracking loop is activated and the phase detector 542 varies the control voltage of the oscillator 540 in order to perform a fine tuning of the clock signal CLK_TX' thereby adjusting the oscillation frequency and phase of the clock signal CLK_TX' with respect to the data signal D_RX.

Similar PLL controls (comprising a phase detector, a charge pump and a loop filter) are used in most CDR architectures (with or without reference clock) in order to perform a fine tuning of the oscillation frequency and phase of the clock signal CLK_TX' generated by a voltage controlled oscillator. Reference can be made for this purpose, e.g., to document Ming-ta Hsieh and Gerald E. Sobelman, *"Architectures for Multi-Gigabit Wire-Linked Clock and Data Recovery"*, IEEE Circuits and Systems Magazine, December 2008, showing example topologies of CDR circuits.

FIG. 5 shows a possible implementation of the decision circuit 52, which is known. Specifically, in the example of FIG. 5 considered, the decision circuit 52 is based on a DLL which comprises a voltage controlled delay line (VCDL) 522, such as a series of inverters with variable supply voltage, and at least a phase tracked control loop comprising a phase detector 524, a charge pump 526 and a loop filter 528, such as a capacitor.

Specifically, the received data signal D_RX is provided at input to the voltage controlled delay line, which delays the data signal D_RX as a function of a given control voltage. The delayed data signal is then provided to the phase detector 524 which generates via the charge pump 526 and the loop filter 528 the control voltage for the voltage controlled delay line 522, thereby generating the signal D_RX' which is delayed with respect to the received signal D_RX but synchronized with the clock signal CLK_TX. Generally, also in this case, the delayed data signal may be sampled by one or more flip-flops 530 connected in cascade and which are driven by the clock signal CLK_TX'.

Often the combination of the PLL architecture for the clock recovery (with or without an additional frequency control loop) and the DLL architecture for the data recovery is called "PLUDLL CDR". For other example decision circuits, see also, e.g., W. Rhee, Soyuer M. *"A 10-Gb/s CMOS clock and data recovery circuit using a secondary DLL"*, Proceedings of IEEE Custom Integrated Circuits Conf., September 2003, pp. 81-84.

BRIEF SUMMARY

Embodiments may be directed to a related clock and data recovery circuit, receiver, integrated circuit and/or method.

An embodiment facilitates reducing the influence of cycle slippage in a clock recovery circuit configured to synchronize a clock signal with a reference signal, such as a data signal or a reference clock signal. Moreover, in an embodiment, a corrected slip PLL provides a smooth phase progression, free of any cycle-slippage (CS) jumps. This CS free behavior may be desirable for the delay (phase) dependent data recovery methods as that of the PLL/DLL CDR architecture.

In various embodiments, the clock recovery circuit comprises an oscillator, such as a voltage controlled oscillator, configured to generate a clock signal, wherein the oscillation frequency varies as a function of a control signal. A PLL phase tracking control loop is used to determine the phase error between the reference signal and the clock signal, and vary the control signal as a function of this phase error, thereby increasing or decreasing the oscillation frequency in order to synchronize the clock signal with the reference signal. A similar or phase-based timing element operation can be obtained by a DLL track loop where the control signal varies a time delay instead of an oscillator frequency in the loop.

For example, such a phase tracking control loop may comprise a loop filter configured to generate the control signal of the oscillator, a charge pump providing charge pulses to the loop filter and a phase detector which drives the charge pump as a function of the phase error between the clock signal and the reference signal. For example, in various embodiments the loop filter of the phase tracking control loop operates as a proportional-integral regulator.

The inventor has observed that such phase tracking control loops have a linear region for phase errors (the phase difference between the reference signal and the clock signal) in the range between $-\pi$ and $+\pi$.

For example, in case the phase error is between 0 and $+\pi$, e.g., in case the clock signal is delayed with respect to the reference signal, the average output of the phase tracking control loop should be positive in order to increase the clock frequency. Conversely, in case the phase error is between $-\pi$ and 0, e.g., in case the clock signal advances the reference signal, the average output of the phase tracking control loop should be negative in order to decrease the clock frequency.

However, a cycle slippage event is created when the phase error exceeds this linear range. In this case, the phase detector cannot sustain linearity and does an unexpected abrupt output step that drives the oscillator in the loop away from the equilibrium of a locked situation. The phase detector eventually re-enters a linear behavior where the loop can reach recapture and regulate the loop keeping the phase error bound. The phase tracking control loop when recovering the phase-detector linearity tries to regulate the oscillator to a new equilibrium point, which belongs to a neighbor bit. For example, in case of a positive phase difference, the PD provides a positive output, thereby increasing the clock frequency. When it crosses the $+\pi$ boundary, the phase detector will suddenly detect a phase error of $-\pi$ and provides a negative output, thus acting wrongly in trying to decrease the clock frequency where in fact the phase-difference polarity would need a frequency increase. This phenomena is known as cycle slip.

In various embodiments, the clock recovery circuit comprises for this reason a cycle-slippage detector. The cycle-slippage detector or balancer detects whether the phase error reaches or approaches $-\pi$ or $+\pi$, and acts on the control signal of the oscillator in an effort to avoid that the phase tracking control loop leaves said linear region, e.g., crosses the $-\pi$ and $+\pi$ boundaries. Accordingly, the cycle-slippage detector varies the control signal of the oscillator in order to compensate the potential oscillation wrong-variation created by the phase tracking control loop, thereby "pulling" the control loop again to the original equilibrium point. In real circuits the linearity may be lost as the phase error approaches the boundaries and it is this "approaching" to the edge that the cycle-slippage detector may use to fix to the problem.

For example, in various embodiments, the cycle-slippage detector is implemented using a frequency detector and a respective cycle slip balancer control branch. For example, such a frequency detector may be a configured to: determine that the frequency of the clock signal is higher than the frequency of the reference signal by detecting whether an edge, e.g., the rising edged, of the clock signal consistently overruns a corresponding edge, e.g., the falling edge, of the reference signal, e.g., when the phase difference has undergone a full cycle of phase difference and reaches the $-\pi$ boundary, and determine that the frequency of the clock signal is smaller than the frequency of the reference signal, by detecting whether an edge, e.g., the rising edged, of the reference signal consistently overruns a corresponding edge, e.g., the falling edge, of the clock signal, e.g., when the phase difference has undergone a full cycle of phase difference an reaches the $+\pi$ boundary.

Accordingly, such a frequency detector already provides indication that the phase difference has done one full $2\pi$ cycle (or a multiple number of unit-bit-intervals over time) in a particular direction and by selecting appropriate edges of the reference signal and the clock signal, these $2\pi$ cycles may correspond to the $+\pi$ or $-\pi$ boundary, e.g., the frequency detector signals whether the $+\pi$ or $-\pi$ boundary has been reached.

A sort of predictive function may also be implemented, e.g., by slightly delaying or phase shifting the reference signal and/or the clock signal, such that the $2\pi$ cycle of the frequency detector does not correspond exactly to the $+\pi$ and $-\pi$ boundaries but to $(+\pi-\Delta)$ and $(-\pi+\Delta)$, thereby detecting that the phase error approaches the $+\pi$ or $-\pi$ boundary.

Accordingly, the output of the cycle slippage detector indicates a phase error able to create an overflow of the PD at one linear boundary. Indeed, the linear boundaries of a real PD are not formal discontinuities but rather there is a slope changing gradually. However, the effective 0 output cross is in any case periodic with $2\pi$. The frequency detector serving as an intelligent pulse compensator may thus be used to generate pulses able to compensate the overflow created by the phase detector, e.g., generate a positive pulse when a positive full cycle phase-difference over-run occurs that coincides, in the PD, to the phase error prone to enter the PD nonlinear characteristic near the $+\pi$ boundary, and generate a negative pulse when a negative full cycle phase-difference over-run occurs that coincides in the PD to the phase error is prone to enter the PD nonlinear characteristic near the $-\pi$ boundary. The balancer pulse polarity may be such to prevent the phase track loop to drift away into overflow. For this reason, the CS balancer (acting as a frequency tracking loop) and the phase tracking control loop may have substantially the same response time.

For example, the cycle slip balancer control branch may re-use and share the phase-tracking loop filter configured to generate the control signal of the oscillator. In this case, the frequency detector providing the cycle rotate information may be configured to drive a further charge pump providing charge pulses to the loop filter.

The clock recovery circuit may also comprise a further frequency tracking control loop used during start-up or loss of synchronization in order to perform a coarse regulation of the control signal. In this case, the further frequency tracking control loop has a response time being greater than the response time of the phase tracking control loop. For example, in various embodiments, this further frequency tracking control loop has a loop filter acting as an integral regulator. In an embodiment, a single frequency detector may be employed to provide both autotune functionality and to detect a clock cycle slippage.

In an embodiment, a device comprises: an oscillator, which, in operation, generates a clock signal having a frequency based on a control signal; and oscillator control circuitry, which, in operation: determines a phase error between a reference signal and the clock signal; and determines whether the phase error is within a threshold phase-error range; and generates the control signal based on the determined phase error and on whether the phase error is within the threshold phase-error range. In an embodiment, the reference signal comprises at least one of a data signal and a reference clock signal. In an embodiment, the threshold phase-error range extends between one of: $+\pi$ and $-\pi$, and $+\pi-$delta and $-\pi+$delta, where delta is a threshold value. In an embodiment, said oscillator control circuitry comprises cycle-slippage detection circuitry, which, in operation, monitors said reference signal and said clock signal to determine whether said phase error is at least one $2\pi$ cycle. In an embodiment, said oscillator control circuitry includes a cycle slip balancer control loop having a frequency detector, which, in operation, detects whether the phase error is within the threshold range by determining at least one of: whether an edge of said clock signal overruns a corresponding edge of said reference signal; and whether an edge of said reference signal overruns a corresponding edge of said clock signal. In an embodiment, said cycle slip balancer and a phase tracking loop of the oscillator control circuitry have substantially a same response time. In an embodiment, said oscillator control circuitry comprises: a loop filter configured to generate said control signal of said oscillator; and a first charge pump configured to provide charge pulses to said loop filter as a function of at least one charge-pump control signal, wherein said frequency detector is configured to generate said at least one charge-pump control signal. In an embodiment, said oscillator control circuitry, in operation: generates at least one positive charge pulse when said phase error approaches or reaches $-\pi$; and generates at least one negative charge pulse when said phase error approaches or reaches $-\pi$. In an embodiment, said oscillator control circuitry comprises: a loop filter configured to generate said control signal of said oscillator; a charge pump configured to provide charge pulses to said loop filter as a function of at least one charge-pump control signal; and a phase detector configured to determine said phase error between said clock signal and said reference signal. In an embodiment, the device comprises a frequency tracking control loop, which, in operation: determines a frequency difference between said clock signal and said reference signal; and modifies said control signal as a function of said frequency difference, wherein said frequency tracking control loop has a sole integral type of dynamics with a response time greater than a response time of a phase tracking loop of the oscillator control circuitry. In an embodiment, said frequency tracking control loop is enabled during start-up or loss of synchronization to perform a coarse regulation of said control signal; and a cyclic slip balancer of the oscillator control circuitry and the phase tracking control loop are enabled during data reception to perform a fine regulation of said control signal. In an embodiment, said oscillator is a voltage controlled oscillator.

In an embodiment, a system, comprises: a clock recovery circuit, including: an oscillator, which, in operation, generates a clock signal having a frequency based on a control signal; a phase-tracking loop, which, in operation: determines a phase error between a data signal and the clock signal; and generates the control signal based on the determined phase error; and cycle-slippage detection circuitry, which, in operation: determines whether the phase error is within a threshold phase-error range; and modifies the control signal in response to a determination that the phase error is not within the threshold phase-error range; and data-recovery circuitry, which, in operation recovers data transmitted via said data signal as a function of said clock signal and said data signal. In an embodiment, the data-recovery circuitry comprises at least one of: a delay-locked loop; and one or more flip-flops coupled in cascade. In an embodiment, the system comprises: an optical receiver. In an embodiment, the optical receiver is compatible with a Synchronous Optical Network. In an embodiment, the threshold phase-error range extends between one of: +π and −π; and +π−delta and −π+delta, where delta is a threshold value. In an embodiment, the system comprises: an integrated circuit including at least one of the clock recovery circuit and the data-recovery circuitry.

In an embodiment, a method comprises: generating, using a clock signal having a frequency based on a control signal; determining a phase error between a reference signal and the clock signal; determining whether the phase error is within a threshold phase-error range; and generating the control signal based on the determined phase error and on whether the determined phase error is within the threshold phase-error range. In an embodiment, the reference signal comprises at least one of a data signal and a reference clock signal. In an embodiment, the threshold phase-error range extends between one of: +π and −π; and +π−delta and −π+delta, where delta is a threshold value. In an embodiment, the method comprises: monitoring said reference signal and said clock signal to determine whether said phase error is at least one 2π cycle. In an embodiment, the method comprises: generating at least one positive charge pulse when said phase error approaches or reaches +π; and generating at least one negative charge pulse when said phase error approaches or reaches −π.

In an embodiment, a system comprises: means for generating a clock signal; and means for controlling the means for generating the clock signal based on: a phase error between a data signal and the clock signal; and whether the phase error between said data signal and said clock signal reaches or approaches +π or −π. In an embodiment, the system comprises: means for recovering data from said clock signal and said data signal. In an embodiment, the system comprises: means for receiving optical signals.

BRIEF DESCRIPTION OF THE DRAWINGS

Embodiments of the present disclosure will now be described with reference to the annexed drawings, which are provided purely by way of non-limiting example and in which.

DETAILED DESCRIPTION

Figure 1:
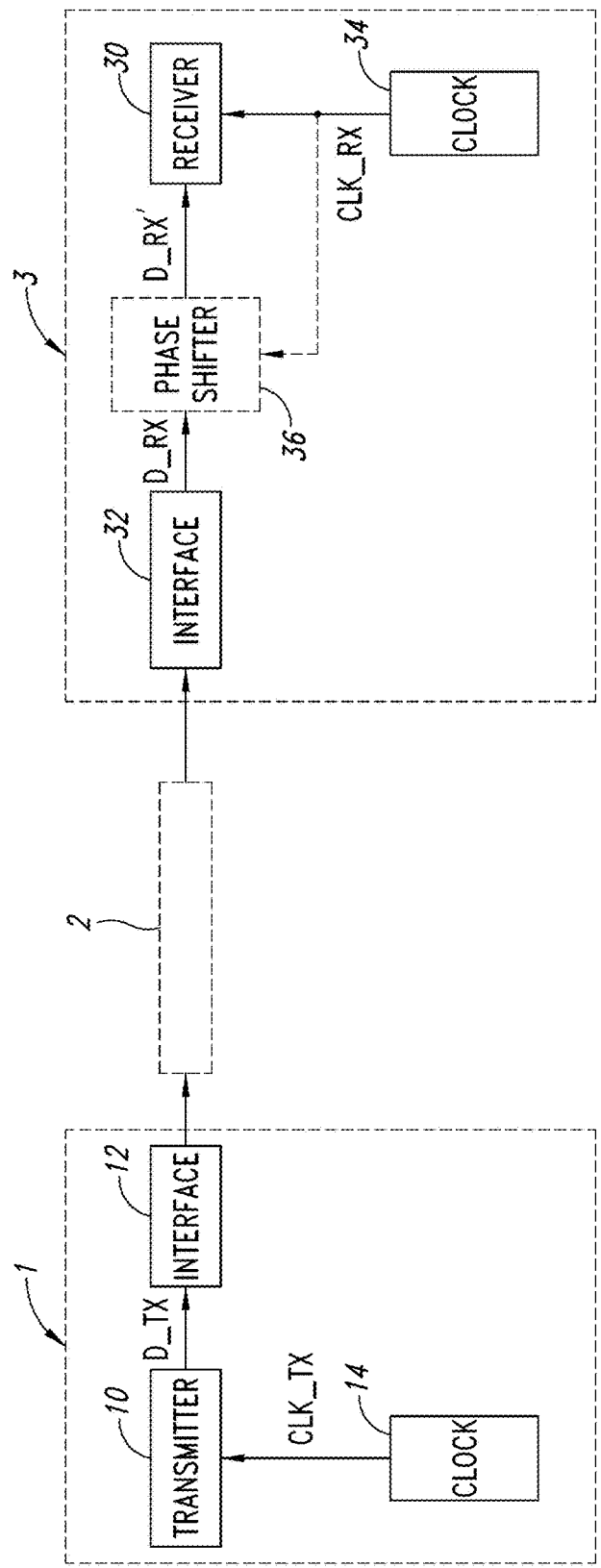
FIGS. 1 to 5 have already been described in the foregoing.

In the following description, numerous specific details are given to provide a thorough understanding of embodiments. The embodiments can be practiced without one or several specific details, or with other methods, components, materials, etc. In other instances, well-known structures, materials, or operations are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

The inventor has observed that PLL structures used for the clock recovery suffer often from a non-linear (NL) behavior known as cycle-slippage (CS). For example, reference can be made to R. Meyr, *"Digital Communication Receivers; synchronization, equalization and signal processing"*, Wiley 1998, Chapter 6 sect 4, for an explanation of this behavior.

Generally, a cycle-slippage results in a clock cycle loss caused by the phase lock loop. Accordingly, a cycle-slippage event occurs when the PD that is the PLL front component is dealing with a residual phase error of +/−π during the phase locking (tracking) functionality. For example, even though the tracking process has experienced a transient in a CDR, the cycle-slippage may cause a shift in the bit-stream alignment resulting in errored-bits. The PLL subsequently recaptures the new stream phase alignment. The error created may then be corrected in the stream transport hierarchy. Typically, a cycle-slippage appears because the phase-detector 542 gets out of its linear operation mode ("hold-range") and will track a new phase being one or several unit intervals distant from the original-bit sample position. This process entails that the clock signal of the oscillator 540 runs a normal non-uniform set of jump transients clearly seen during capture. For example, cycle-slippage may be caused by excess phase-perturbations in the link, during the transient frequency loss and a procured new frequency-capture process, or during stressed telecom jitter tolerance tests.

In the following FIGS. 6 to 9 parts, elements or components which have already been described with reference to FIGS. 1 to 5 are denoted by the same references previously used in such Figures; the description of such previously described elements will not be repeated in the following in order not to overburden the present detailed description.

As mentioned in the foregoing, the present disclosure provides solutions for reducing the influence of cycle-slippage in a PLL of a clock recovery circuit which may create malfunctions in a downstream delay controlled circuitry.

Figure 6:
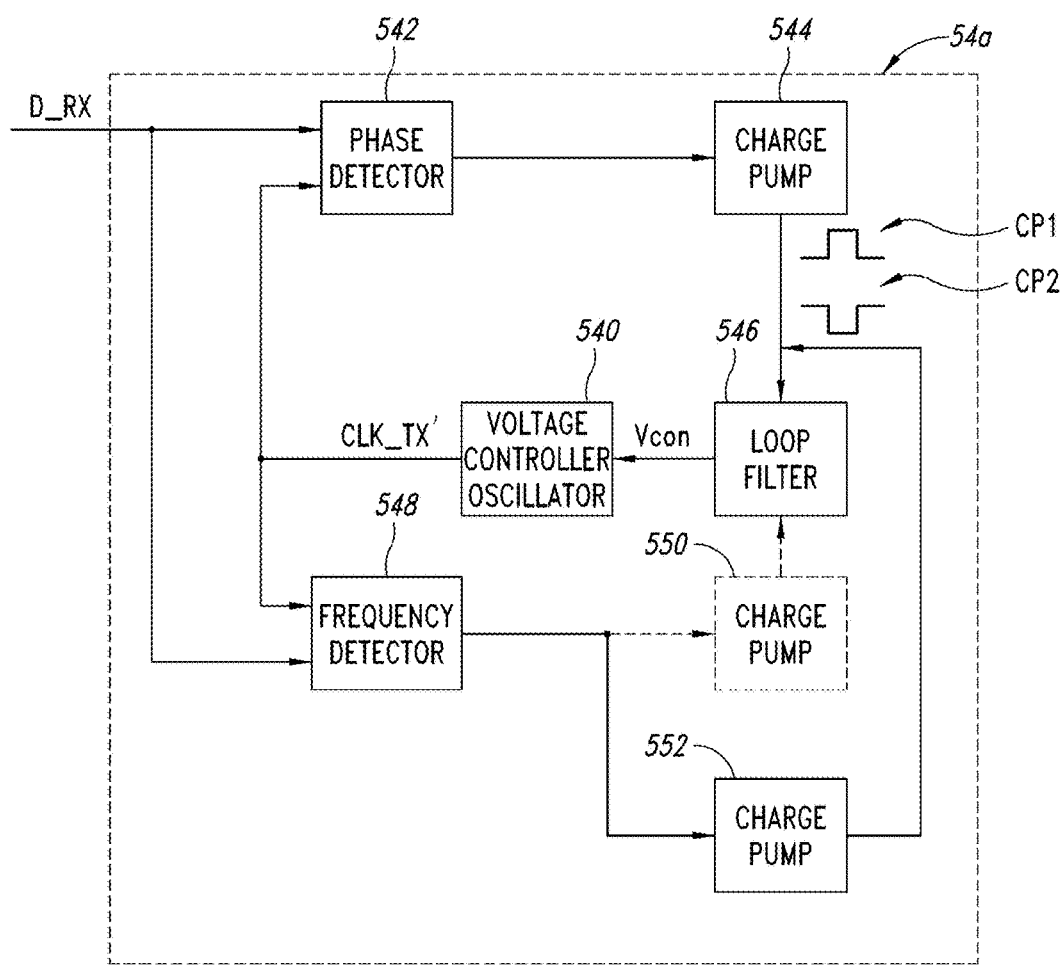
FIG. 6 shows an embodiment of clock recovery circuit in accordance with the present disclosure.

FIG. 6 shows an embodiment of a clock recovery circuit 54a in accordance with the present disclosure.

Figure 2:
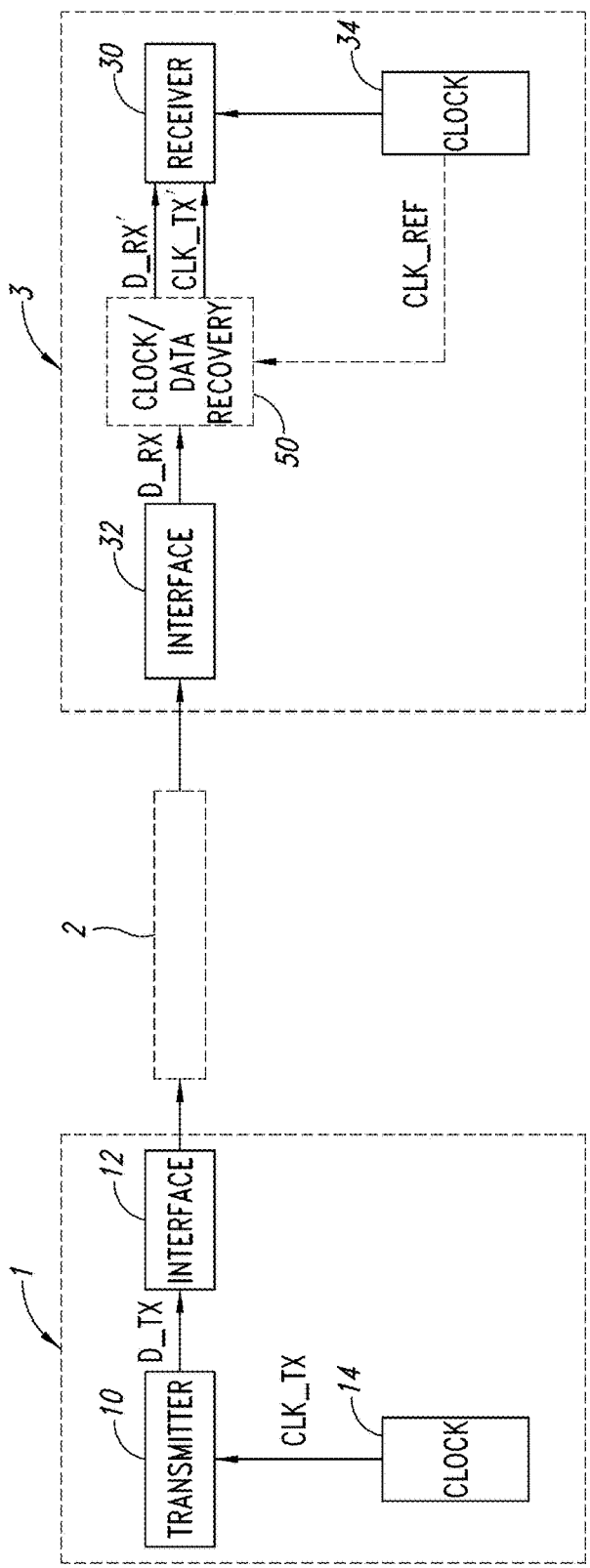
Figure 3:
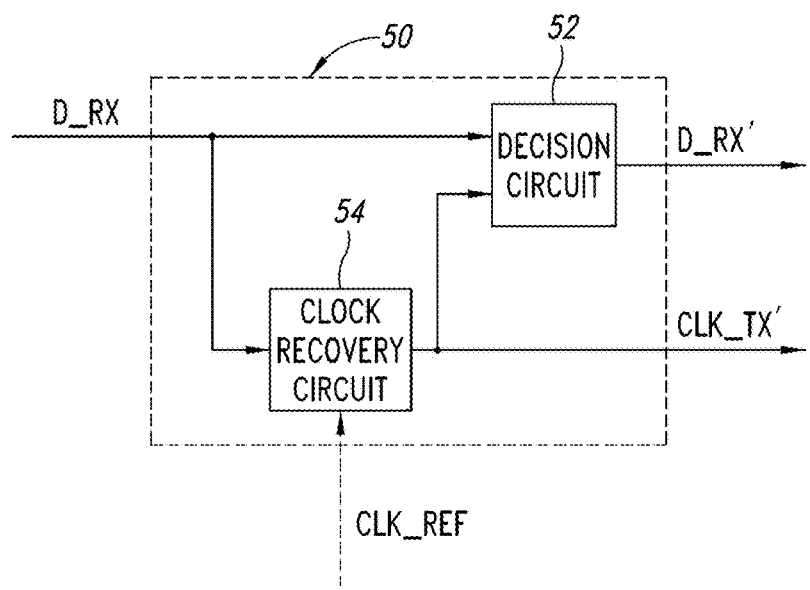
Figure 4:
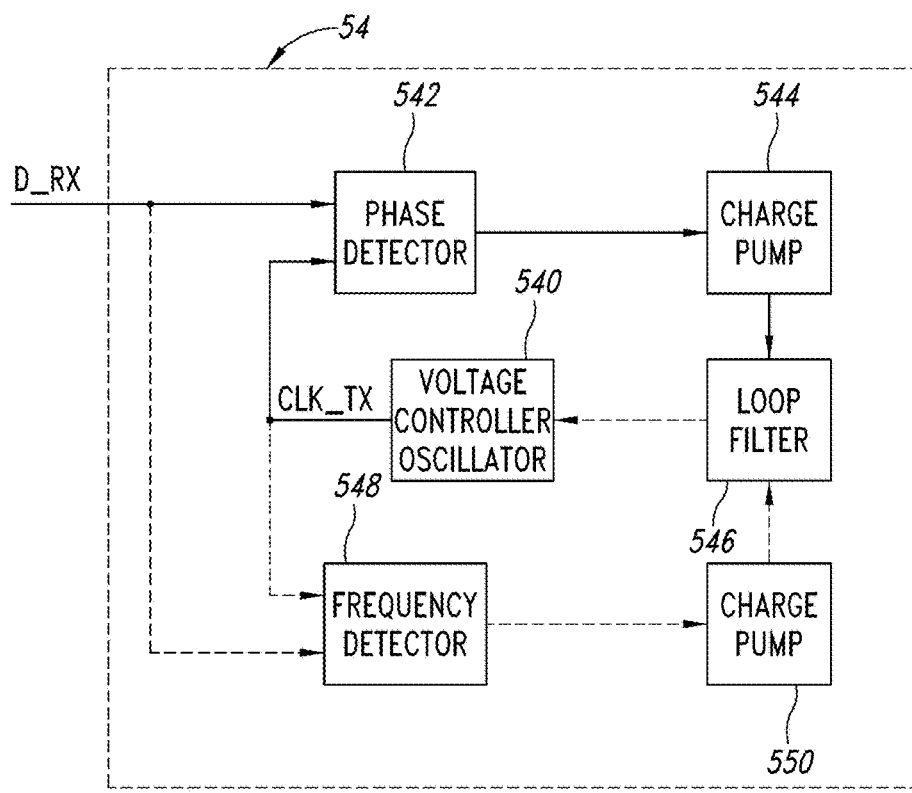

Specifically, the disclosed clock recovery circuit 54a may be used in a clock and data recovery circuit 50 as shown in FIG. 3 or a receiver 3 as shown in FIG. 2, such as an optical receiver, e.g., a SONET compatible receiver. Accordingly the respective description concerning the operation of such a CDR and receiver will not be repeated again.

In the embodiment considered, the clock recovery circuit 54a is based on a PLL.

Accordingly, also in this case, the clock-recover circuit 54a comprises a voltage controlled oscillator 540, such as a series of inverters with variable supply voltage, generating a clock signal CLK_TX' as a function of a control voltage Vcon and at least a phase tracking control loop.

Specifically, in the embodiment considered, the phase tracking control loop comprising a phase detector 542, a charge pump 544 and a loop filter 546.

Specifically, in the embodiment considered, the phase detector 542 performs a phase comparison between the received data D_RX and the clock signal CLK_TX' generated by the voltage-controlled oscillator 540. Next, the phase detector 542 drives the charge pump 544 in order to vary the control voltage Vcon via the loop filter 546 until the clock signal CLK_TX' is synchronized with the data signal D_RX.

In various embodiments, the phase detector 542, such as a Hogge phase detector, signals to the charge pump 544 whether the voltage Vcon should be increased, decreased or remain unaltered. For example, a single three state control signal may be used for this purpose.

Figure 7:
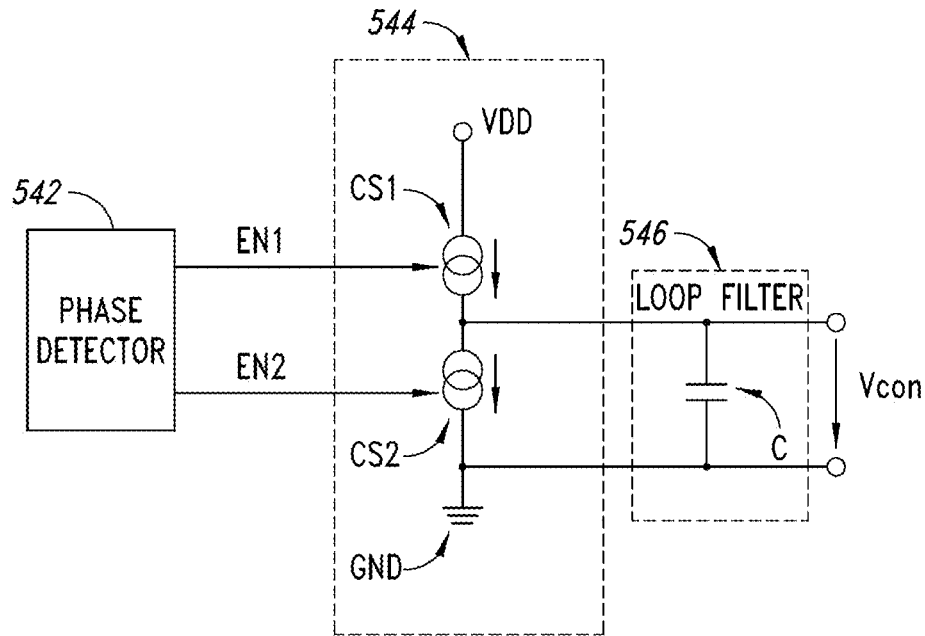
FIGS. 7 and 8 show details of the clock recovery circuit of FIG. 6.

Conversely, FIG. 7 shows an embodiment, in which the charge pump 544 comprises two current source CS1 and CS2 connected between a supply voltage VDD and ground GND. In this case, the phase detector may generate two enable signals EN1 and EN2, which enable the current sources CS1 and CS2, respectively. Accordingly, in the embodiment considered:
- a positive current/charge pulse will be provided at the output of the charge pump 544 when the signal EN1 enables the current source CS1;
- a negative current/charge pulse will be provided at the output of the charge pump 544 when the signal EN2 enables the current source CS2; and
- no current/charge pulse will be provided at the output of the charge pump 544 when both current sources are disabled.

Figure 8:
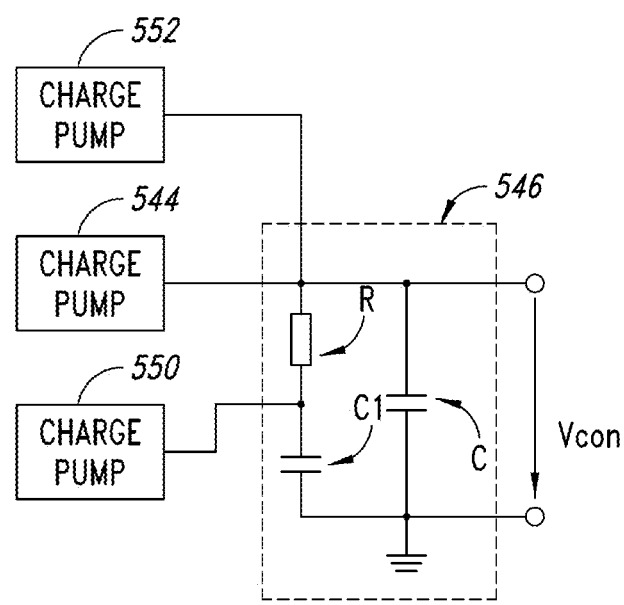

In the embodiment considered in FIG. 8, the output of the charge pump 544 is connected to the loop filter 546, which for example may comprise a capacitor C (which could also be included directly in the charge pump 544). Accordingly, in the embodiment considered, the positive or negative current/charge pulse at the output of the charge pump 544 will charge or discharge the integrating capacitor C, and accordingly increase or decrease the control voltage Vcon. Those of skill in the art will appreciate that the loop filter 546 may also comprise further components.

Generally, possible other implementations of the phase detector 542, the charge pump 544 and the loop filter 546 will occur to those skilled in the art after reviewing this disclosure, rendering a more detailed description herein superfluous. For example reference can be made to document T. H. Lee, J. F. Bulzacchielli *"A 155-MHz Clock Recovery Delay- and Phase-Locked Loop"*, IEEE Journal of Solid-State Circuits, Volume 27, Issue 12, December 1992.

In various embodiments, the clock recovery circuit 54 may comprise a frequency tracking loop comprising a frequency detector 548 (see FIG. 6), a charge pump 550 and a loop filter, which may correspond to the loop filter 546. Specifically, the frequency detector 548 may perform a frequency comparison between the input data D_RX and the voltage-controlled oscillator output CLK_TX'. Specifically, the control voltage is varied (e.g., increased or decreased) until the oscillation frequency of the signal CLK_TX' corresponds approximately to the input data rate.

Accordingly, the charge pump circuit 544 shown in FIG. 7 may also be used for the charge pump 550 and, for example, the charge pump 550 may provide:
- a positive current/charge pulse when a signal EN1 provided by the frequency detector 548 enables a current source CS1;
- a negative current when a signal EN2 provided by the frequency detector 548 enables a current source CS2; or
- no current/charge pulse when both current sources are disabled.

For example, this is the typical behavior of so called bang-bang frequency-detector (BBFD). For example, such frequency-detectors often include a poly-phase filter in order to generate poly-phase quadrature clocks.

For example, FIG. 8 shows a possible embodiment of the loop filter 546 which is able to combine the signals received from the charge pump 544 of the phase detect branch and the charge pump 550 for the frequency tuning branch.

Specifically, in the embodiment considered, the output of the charge pump 544 is connected as before to the capacitor C that shunts the R-C1 series branch. Conversely, the output of the charge pump 550 is connected to a further capacitor C1 within the R-C1 series branch. Moreover, the negative terminal of the capacitor C1 is connected (e.g., directly) to the negative terminal of the capacitor C, and the positive terminal of the capacitor C1 is connected (e.g., directly) via a resistor R to the positive terminal of the capacitor C.

In various embodiments, the capacitor C1 is the primary filter capacitor which together with the resistor R forms a P-I (proportional-integral) regulator, and the capacitor C represents an additional filter which further filters the control voltage Vcon. For example, typically, the capacitance of the capacitor C may be between 1/10 and 1/40 of the capacitance of the capacitor C1.

In various embodiments, the frequency tracking loop is activated during start-up or loss of synchronization in order to generate the control voltage Vcon for the oscillator 540 via the charge pump 550. Specifically, in the embodiment considered the charge pump 546 charges the capacitor C1 (which represents an integral regulator), and the resistor R and the capacitor C1 represent an additional RC low pass filter for the voltage Vcon.

Once the original frequency difference falls within threshold limits, the operation of the frequency control loop may stop and the control may fall into the governance of the PD, which before could be switched off or in any case had a negligible impact on the loop transient. Then the phase detector 542 working in a condition of quasi iso-frequency of data and clock varies the control voltage Vcon of the oscillator 540 by directly applying charge to the RC filter, e.g., the proportional-integral regulator, (and the additional capacitor C) via the charge pump 544, thereby permitting a final linear tuning of the control voltage Vcon.

Accordingly, in the embodiment considered, the frequency detector 548 and the charge pump 550 improve the frequency-capture transient by injecting charge to the loop filter 546 and once frequency capture occurs and as the PD is governing the loop, the frequency detector stops contributing any output into the loop filter.

Figure 5:
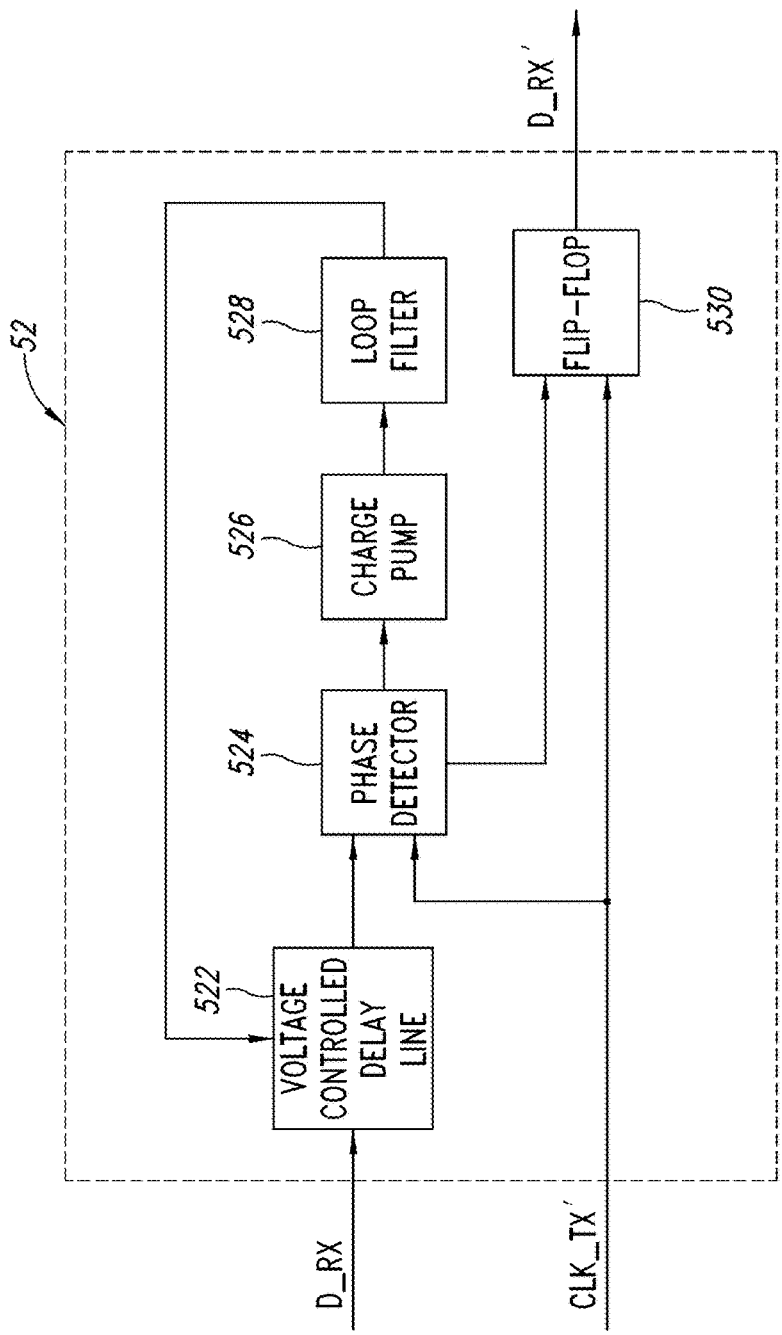

As mentioned in the foregoing, such a clock recovery circuit 54a, in particular the phase tracking loop, may be exposed to cycle-slippage events, which may cause malfunctions of the detection/decision circuit such as a DLL based detection circuit 52 as shown in FIG. 5.

Specifically, such phase tracking control loops 54a have a linear time invariant operation as long as the residual phase-error at the phase detect output, so called phase error (the phase difference between the data signal and the clock signal), is in the range between $-\pi$ and $+\pi$. For example, in case the phase error is between 0 and $+\pi$, e.g., in case the clock signal is delayed with respect to the data signal, the average output of the phase detector branch should be positive in order to increase the clock frequency and timely drive the phase-error to zero. Conversely, in case the phase error is between $-\pi$ and 0, e.g., in case the clock signal advances the data signal, the average output of the phase detector control branch should be negative in order to decrease the clock frequency and timely drive the phase-error to zero.

However, a cycle slippage event may be created when the phase error exceeds this range, because the phase tracking control loops wrongly tries to regulate the oscillator to a new equilibrium point. For example, in case the phase difference approaches the +π boundary it delivers a positive output. If it goes beyond, the phase-detect characteristics provides the wrong output polarity, due to a nonlinear discontinuity of the curve, a negative output is suddenly applied. This means that for very narrow phase swings around the discontinuity there can be commands for the oscillator into two opposite directions. In fact, once the boundary is crossed, the phase detector may indeed detect a phase error of −π, thus trying to decrease the dock frequency. This unwanted situation is seen as a stimulus for the loop which operating in the new sector of the characteristic will travel to a new stable operating point that has to be sustainable by the linear range. Else it will continue jumping cycles till such sustainability exists and finally settles to a linear lock state.

Generally, when the clock recovery process is started from a detuned condition (transmission clock CLK_TX and oscillation clock signal CLK_TX' differ within certain operative ranges), several CS events occur until the PLL transient makes the VCO approach the link rate and the CS slip-rate (CS per second) decreases and becomes nil. Specifically, zero CS events should occur for a locked PLL. In fact, for small phase errors, the phase tracking loop is within the linear region, in which the linear phase tracking loop may compensate small errors, and CS events do not exist or are generated.

However, CS events may also be created during normal operation, e.g., due to excessive jitter. For example, this behavior may come into question in the SONET telecom compliance jitter tolerance or "jitol tests". During these tests, a clock and data recovery circuit 50 is initially operated in a stable locked operative condition, and then artificially stressed by a phase-modulation, typically a sinusoidal-modulated jitter, in order to measure the PLL jitter tolerance, which still permits to receive the bit-stream without errors. For example, these tests typically stress the phase detector 542 to operate with substantial phase-errors causing overflows of the [−π; +π] linear limits of the phase detector 542.

Usually, the dynamics of the clock recovery circuit 54a follow phase-errors and its variation within the band limits and respect the PD transfer range.

However, as schematized in FIG. 6, in case a CS event occurs, the phase detector 542 will drive the charge pump 544 in order to generate a wrong charge-packets CP1, e.g., a positive current pulse, which is fed to the loop filter 546, which will move the voltage Vcon away from the correct value resulting in a undesired clock frequency variation.

The phase tracking loop will then try to find a new equilibrium point, which usually corresponds to a neighbor equilibrium-point (attractor), and the bits are sampled with the wrong clock frequency and/or phase, e.g., errored-bits at the link physical-layer (PHY) may be produced. In fact, in the case of a DLL base detection circuit, as long as the CS is present and causes phase accumulations, the DLL loop finite-delay capability has usually no possibility to compensate the disturbed clock signal CLK_TX' in particular with regards to the signal phase.

In order to facilitate reducing the problem of these events, in various embodiments, the clock recover circuit 54a comprises a cycle-slippage detection circuit.

Specifically, this cycle-slippage detector and balancer detects whether the phase error reaches or approaches −π or +π, and varies the control signal of the oscillator in order to compensate the potential oscillation wrong-variation created by the phase tracking control loop experiencing slippage, thereby "pulling" the control loop to the original equilibrium point. In real circuits the linearity is lost as the phase error approaches the boundaries and it is this "approaching" to the edge that the cycle-slippage detector may use to fix the problem.

For example, in various embodiments, the cycle-slippage detection circuit is based on an additional high-speed frequency detector branch able to detect or predict cycle-slippage events during bit-stream traffic.

In fact, such a frequency detector is able to detect whether a full cycle phase-difference (2π) over-run occurs, which may be selected in order to coincides, in the PD, to the phase error prone to enter the PD nonlinear characteristic near −π or +π. Accordingly, the respective balancer circuit may be used to vary the control signal of the oscillator in order to compensate the variation created by the phase tracking control loop, thereby "pulling" the control loop away from the risk zone and towards the originally correct tracking operation.

Specifically, the high-speed frequency detector branch may comprise a frequency detector configured to:
  determine that the frequency of the clock signal is higher than the frequency of the data signal by detecting whether an edge, e.g., the rising edged, of the clock signal overruns a corresponding edge, e.g., the falling edge, of the data signal, e.g., observed from the PD this happens when the phase difference approaches the −π boundary; one output pulse is generated for each full cycle of 2π of phase over-run or reciprocal surpass, and
  determine that the frequency of the clock signal is smaller than the frequency of the data signal, by detecting whether an edge, e.g., the rising edged, of the data signal overruns a corresponding edge, e.g., the falling edge, of the clock signal, e.g., observed from the PD this happens when the phase difference approaches the PD+π boundary; one output is given for each full cycle of 2π of phase over-run or reciprocal surpass.

Accordingly, in various embodiments, the output of the frequency detector 548 provides an indication whether the phase error (the phase difference between the data signal and the clock signal) runs 2π, indicting thereby whether the +π or −π boundary has been reached.

A sort of predictive function may also be implemented, e.g., by slightly delaying or phase shifting the data signal and/or the clock signal, such that the 2π cycle of the frequency detector 548 does not correspond exactly to the +π and −π boundaries but to (+π−Δ) and (−π+Δ), thereby detecting that that the phase error approaches the +π or −π boundary.

For example, in various embodiments, this frequency tracking loop may reuse the frequency detector 548 (in case present) or comprise an additional frequency detector. Moreover, the high-speed cycle slip balancer (which acts as a frequency tracking loop) comprises a dedicated charge pump 552.

Specifically, while the conventional frequency tracking loop (548, 550, 546 and 540) has a large response time and is slow with respect to the phase tracking control loop (542, 544, 546, 540), the high-speed cycle slip balancer (552, 546, 540) should have a response time being comparable with the response time of phase tracking control loop (542, 544, 546, 540).

In various embodiments, the cycle-slippage detection/balancer circuit is moreover configured to compensate the charge pulses CP1 generated by the charge pump 544 in case and through a generation of a cycle slippage event by generating corresponding compensation charge pulses CP2 via the charge pump 552, e.g., the cycle slippage detector may be configured to:

generate at least one positive charge pulse when the charge pump 544 generates a negative charge pulse due to a cycle slippage, e.g., when as the phase error is reaching the +π nonlinearity boundary, or generate at least one negative charge pulse when the charge pump 544 generates a positive charge pulse due to a cycle slippage, e.g., as the phase error is reaching the −π nonlinearity boundary.

For example, as shown in FIG. 6, in various embodiments, the compensation charge pulses may be injected directly from the output line of the charge pump 544, e.g., the output of the charge pump 552 may be connected to the output of the charge pump 544 (see also FIG. 8 for a possible implementation of the loop filter 546). This connection facilitates the control loops having a comparable response time. However, the charge pump 552 may also be connected to another node in the loop filter 546, which still permits to obtain similar response times.

Accordingly, in the embodiment considered, the phase detector 542 and the frequency detector 548 use separated and dedicated charge pumps 544 and 552, but shared the same loop-filter 546.

Specifically, in the embodiment considered, two separate charge pumps 550 and 552 are used for the optional frequency tracking loop and the high speed cycle-slip balancer charge contribution to the filter. In an embodiment, this has the advantage that the gains of the frequency control branch and the cycle slip balancer contribution branch may be different, e.g., the charge pulses provided by the charge pumps may be different (see e.g., current sources CS1 and CS2 in FIG. 7). Moreover, the charge pumps 550 and 552 may also have different working speeds, e.g., the charge pump 550 is usually driven by a beat-frequency while the charge pump 552 may be wide band to respond and balance rapid pulses delivered by the phase-detector branch.

Accordingly, in the embodiment considered, the high speed cycle slip balancer (548, 552, 546, 540) may operate as a forward suppressor able to detect an imminent overflow of the phase detector and act timely. This operation may be done on the bit-by-bit basis, by sending the received data D_RX in parallel to the phase detector 542, e.g., a Hogge linear-phase detector, and the CS-detector 548, for example, based on a BBFD.

In an embodiment, an advantage of such a BBFD is that the charge pump 552 generates only positive or negative charge pulses, when a cycle-slip is imminent which correspond to the phase error approaching the +/−π PD linear boundaries. Accordingly, the BBFD may provide a deadband behavior for phase errors within −π and +π, in which the CS detector does not interfere with the normal PLL linear-mode. Accordingly, when the phase error reaches +/−π, the CS detector circuit will feed charge into the loop filter 546 pulling the control voltage Vcon towards the transfer-origin, thereby reducing the risk of a CS-drift towards an undesired neighbor-bit event which would entail a bit error.

In order to better highlight an advantage of an embodiment, FIGS. 9A, 9B, 10A, 10B and 10C show a comparison between a conventional PLL based solution (as shown e.g., in FIG. 4) and an embodiment of the proposed solution with CS detector, wherein in both cases an excessive sinusoidal phase error has been applied that results in undesired CSs.

Figure 9A:
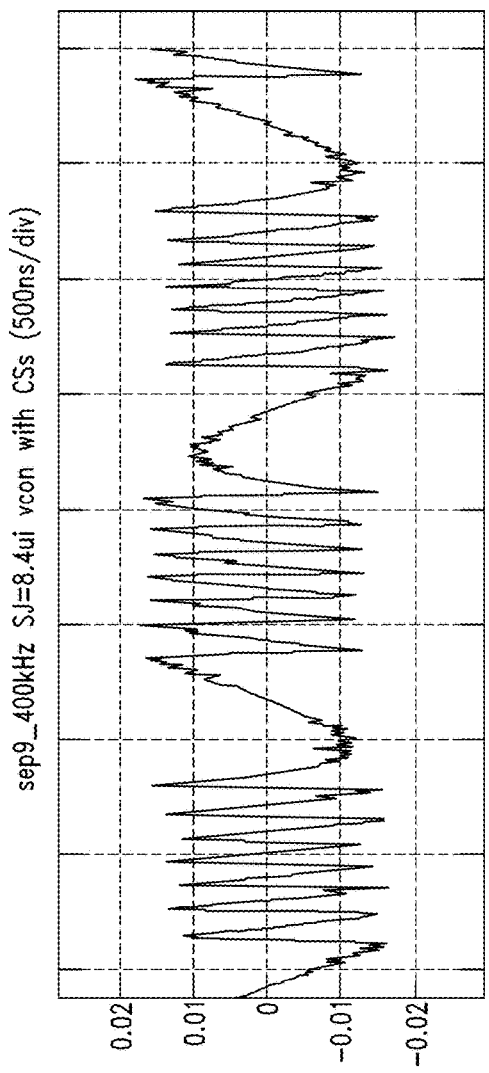
FIGS. 9A, 9B, 10A, 10B and 10C show examples of waveforms that may occur in the circuits of FIGS. 4 and 6, respectively.
Figure 9B:
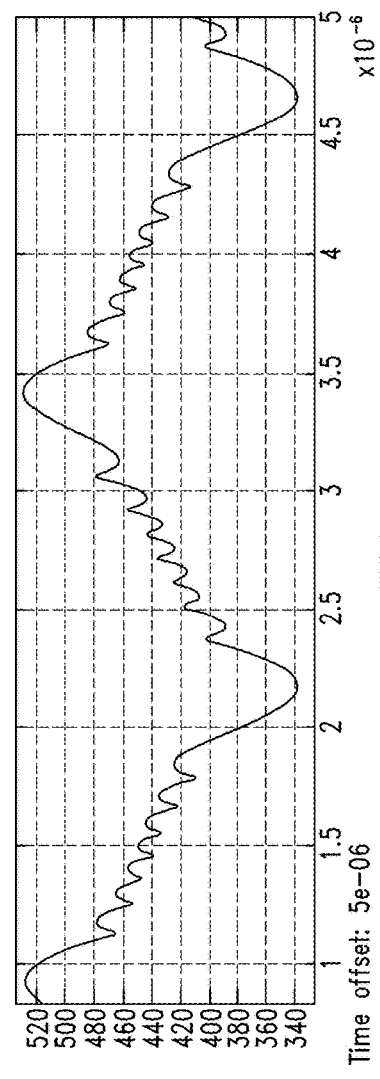
Figure 10A:
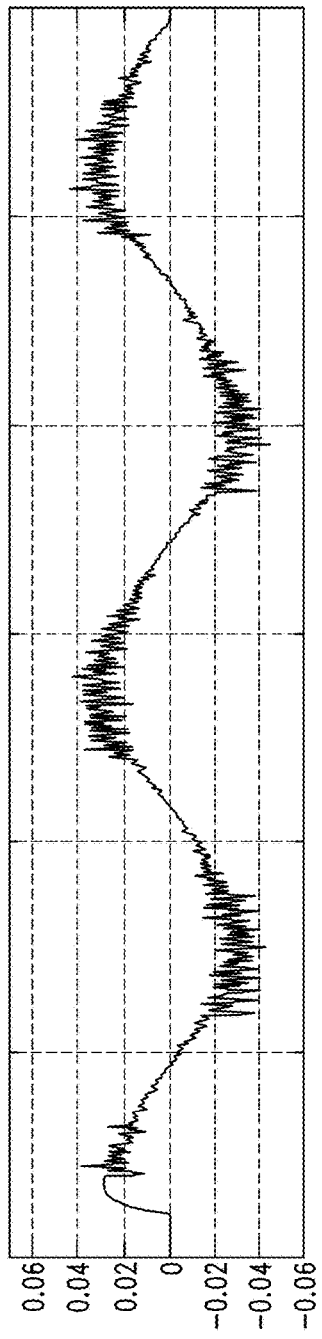
Figure 10B:
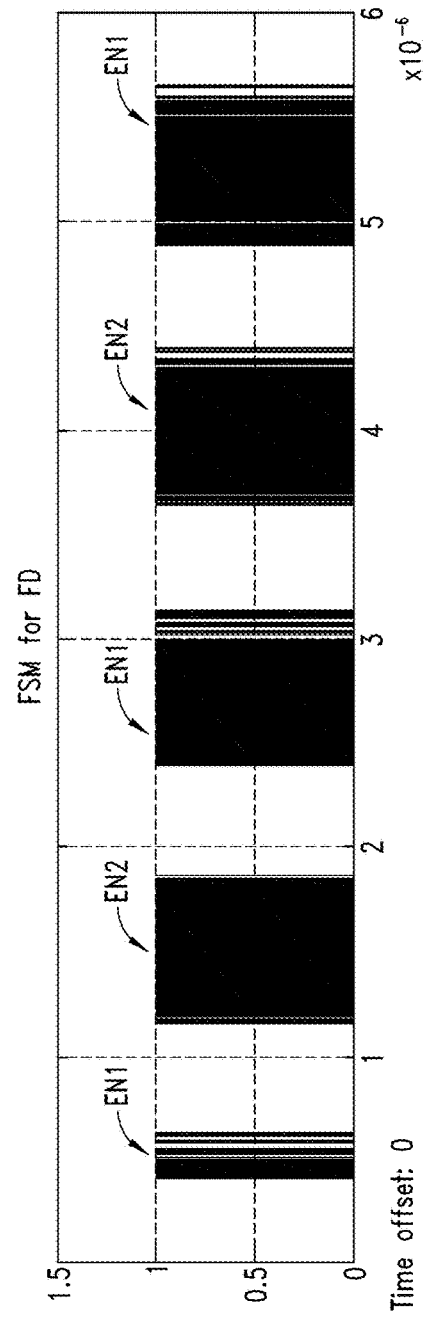
Figure 10C:
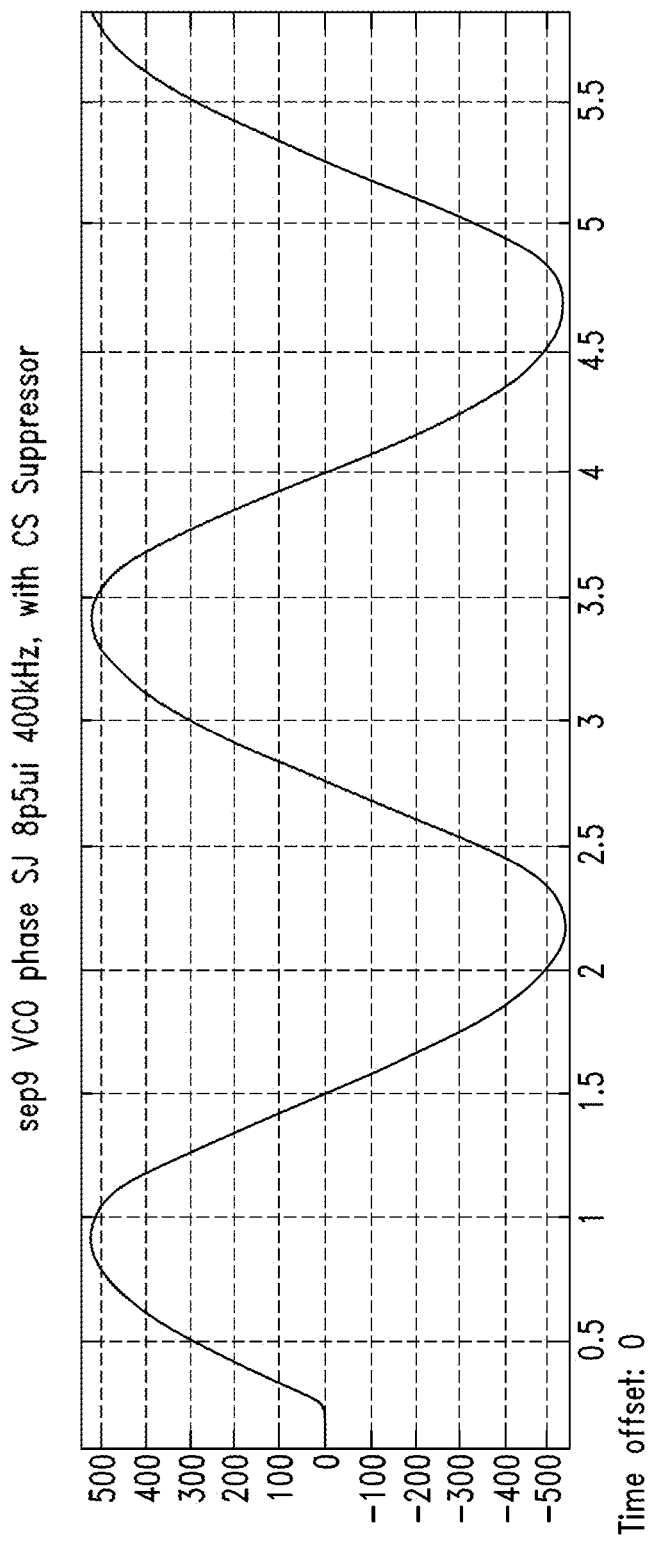

Specifically, FIGS. 9a and 10a show the variation of the control voltage Vcon and FIGS. 9b and 10c show the respective phase variation of the oscillation signal CLK_TX', respectively. Finally, FIG. 10b shows the output of the CS detector 548, wherein the first, third and fifth pulse group belong to the enable signal EN1, which creates positive charge pulses via the charge pump 552, and the second and fourth group belong to the enable signal EN2, which creates negative charge pulses via the charge pump 552.

As becomes evident, the phase error in FIG. 9c follows thoroughly the applied sinusoidal phase error.

In fact, in the conventional PLL shown in FIGS. 9a and 9b, the PLL with its complete filter RC-C1 the CS events are seen with time spans of the modulating few MHz signal. The 1 us at 10G transmission means 10k bits. The CS events form a train of comb like transients on the control voltage Vcon. Each finger corresponds to the effect of a CS from the excessive SJ modulation.

In an embodiment, the clock recovery circuit may also be used to synchronize the clock signal CLK_TX' with another reference signal, such as a reference clock signal.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
an oscillator, which, in operation, generates a clock signal having a frequency based on a control signal; and
oscillator control circuitry, which, in operation:
determines a phase error between a reference signal and the clock signal; detects cycle-slippage based on whether the phase error is within a threshold phase-error range; and
generates the control signal based on the determined phase error and on whether cycle-slippage has been detected, wherein said oscillator control circuitry, in operation:
generates at least one positive charge pulse when said phase error approaches or reaches +π; and
generates at least one negative charge pulse when said phase error approaches or reaches −π.

2. The device of claim 1 wherein the reference signal comprises at least one of a data signal and a reference clock signal.

3. The device of claim 1 wherein, the threshold phase-error range extends between one of:
+π and −π; and
+π−delta and −π+delta, where delta is a threshold value.

4. The device of claim 1 wherein said oscillator control circuitry comprises cycle-slippage detection circuitry, which, in operation, monitors said reference signal and said clock signal to determine whether said phase error is at least one 2π cycle.

5. The device of claim 1 wherein said oscillator control circuitry includes a cycle slip balancer control loop having a frequency detector, which, in operation, detects whether the phase error is within the threshold range by determining at least one of:
whether an edge of said clock signal overruns a corresponding edge of said reference signal; and whether an edge of said reference signal overruns a corresponding edge of said clock signal.

6. The device of claim 5 wherein said cycle slip balancer and a phase tracking loop of the oscillator control circuitry have substantially a same response time.

7. The device of claim 5 wherein said oscillator control circuitry comprises:
a loop filter configured to generate said control signal of said oscillator; and
a first charge pump configured to provide charge pulses to said loop filter as a function of at least one charge-pump control signal, wherein said frequency detector is configured to generate said at least one charge-pump control signal.

8. The device of claim 1 wherein said oscillator control circuitry comprises:
a loop filter configured to generate said control signal of said oscillator;
a charge pump configured to provide charge pulses to said loop filter as a function of at least one charge-pump control signal; and
a phase detector configured to determine said phase error between said clock signal and said reference signal.

9. The device of claim 1, wherein said oscillator is a voltage controlled oscillator.

10. A device, comprising:
an oscillator, which, in operation, generates a clock signal having a frequency based on a control signal;
oscillator control circuitry, which, in operation:
determines a phase error between a reference signal and the clock signal;
detects cycle-slippage based on whether the phase error is within a threshold phase-error range; and
generates the control signal based on the determined phase error and on whether cycle-slippage has been detected; and
a frequency tracking control loop, which, in operation:
determines a frequency difference between said clock signal and said reference signal; and
modifies said control signal as a function of said frequency difference, wherein said frequency tracking control loop has a response time greater than a response time of a phase tracking loop of the oscillator control circuitry.

11. The device of claim 10 wherein said oscillator control circuitry, in operation:
generates at least one positive charge pulse when said phase error approaches or reaches +π; and
generates at least one negative charge pulse when said phase error approaches or reaches −π.

12. The device of claim 10 wherein, in operation:
said frequency tracking control loop is enabled during start-up or loss of synchronization to perform a coarse regulation of said control signal; and
a cyclic slip balancer of the oscillator control circuitry and the phase tracking control loop are enabled during data reception to perform a fine regulation of said control signal.

13. A system, comprising:
a clock recovery circuit, including:
an oscillator, which, in operation, generates a clock signal having a frequency based on a control signal;
a phase-tracking loop, which, in operation:
determines a phase error between a data signal and the clock signal; and
generates the control signal based on the determined phase error; and
cycle-slippage detection circuitry, which, in operation:
detects cycle-slippage based on whether the phase error is within a threshold phase-error range; and
modifies the control signal in response to detection of cycle slippage; and
data-recovery circuitry, which, in operation recovers data transmitted via said data signal as a function of said clock signal and said data signal, wherein said cycle-slippage detection circuitry, in operation:
generates at least one positive charge pulse when said phase error approaches or reaches +π; and
generates at least one negative charge pulse when said phase error approaches or reaches −π.

14. The system of claim 13 wherein the data-recovery circuitry comprises at least one of:
a delay-locked loop; and
one or more flip-flops coupled in cascade.

15. The system of claim 13, comprising:
an optical receiver.

16. The system of claim 15 wherein the optical receiver is compatible with a Synchronous Optical Network.

17. The system of claim 13 wherein the threshold phase-error range extends between one of:
+π and −π; and
+π−delta and −π+delta, where delta is a threshold value.

18. The system of claim 13, comprising:
an integrated circuit including at least one of the clock recovery circuit and the data-recovery circuitry.

19. The system of claim 13 wherein said cycle-slippage detection circuitry includes a cycle slip balancer control loop having a frequency detector, which, in operation, detects whether the phase error is within the threshold range by determining at least one of:
whether an edge of said clock signal overruns a corresponding edge of said reference signal; and
whether an edge of said reference signal overruns a corresponding edge of said clock signal.

20. A method, comprising:
generating a clock signal having a frequency based on a control signal;
determining a phase error between a reference signal and the clock signal;
detecting cycle-slippage based on whether the phase error is within a threshold phase-error range; and
generating the control signal based on the determined phase error and on whether cycle-slippage has been detected, wherein the method includes:
generating at least one positive charge pulse when said phase error approaches or reaches +π; and
generating at least one negative charge pulse n said phase error approaches or reaches −π.

21. The method of claim 20 wherein the reference signal comprises at least one of a data signal and a reference clock signal.

22. The method of claim 20 wherein the threshold phase-error range extends between one of:
+π and −π; and
+π−delta and −π+delta, where delta is a threshold value.

23. The method of claim 20, comprising:
monitoring said reference signal and said clock signal to determine whether said phase error is at least one 2π cycle.

24. The method of claim 20 wherein said detecting cycle-slippage includes determining at least one of:
whether an edge of said clock signal overruns a corresponding edge of said reference signal; and whether an edge of said reference signal overruns a corresponding edge of said clock signal.

25. A system, comprising:

means for generating a clock signal; and means for controlling the means for generating the clock signal based on:

a phase error between a data signal and the clock signal; and detection of cycle-slippage, wherein cycle-slippage is detected based on whether the phase error between said data signal and said clock signal reaches or approaches $+\pi$ or $-\pi$, wherein the means for controlling includes means for generating:

at least one positive charge pulse when said phase error approaches or reaches $+\pi$; and at least one negative charge pulse when said phase error approaches or reaches $-\pi$.

26. The system of claim 25, comprising:

means for recovering data from said clock signal and said data signal.

27. The system of claim 25, comprising:

means for receiving optical signals.

28. A system, comprising:

a clock recovery circuit, including:

an oscillator, which, in operation, generates a clock signal having a frequency based on a control signal;

a phase-tracking loop, which, in operation:

determines a phase error between a data signal and the clock signal; and generates the control signal based on the determined phase error; and cycle-slippage detection circuitry, which, in operation:

detects cycle-slippage based on whether the phase error is within a threshold phase-error range; and modifies the control signal in response to detection of cycle slippage; and data-recovery circuitry, which, in operation recovers data transmitted via said data signal as a function of said clock signal and said data signal, wherein the clock recovery circuit includes a frequency tracking control loop, which, in operation:

determines a frequency difference between said clock signal and said data signal; and modifies said control signal as a function of said frequency difference, wherein said frequency tracking control loop has a response time greater than a response time of the phase tracking loop.

29. The system of claim 28 wherein said cycle-slippage detection circuitry, in operation:

generates at least one positive charge pulse when said phase error approaches or reaches $+\pi$; and generates at least one negative charge pulse when said phase error approaches or reaches $-\pi$.

30. A method, comprising:

generating a clock signal having a frequency based on a control signal;

determining a phase error between a reference signal and the clock signal;

detecting cycle-slippage based on whether the phase error is within a threshold phase-error range; and generating the control signal based on the determined phase error and on whether cycle-slippage has been detected, wherein the method includes:

determining a frequency difference between said clock signal and said reference signal; and modifying said control signal as a function of said frequency difference, wherein a frequency tracking control loop which determines the frequency difference has a response time greater than a response time of a phase tracking loop which determines the phase difference.

31. The method of claim 30, comprising:

generating at least one positive charge pulse when said phase error approaches or reaches $+\pi$; and generating at least one negative charge pulse when said phase error approaches or reaches $-\pi$.

* * * * *